(12) United States Patent
Morin et al.

(10) Patent No.: US 10,271,446 B2
(45) Date of Patent: Apr. 23, 2019

(54) ELECTRICAL GROUNDING COMPONENT AND CORRESPONDING ELECTRONIC BOARD AND ELECTRONIC DEVICE

(71) Applicant: THOMSON LICENSING, Issy les Moulineaux (FR)

(72) Inventors: Pierre-Marie Morin, Sainte Gemmes sur Loire (FR); Dominique Lo Hine Tong, Rennes (FR); Jean-Marc Le Foulgoc, Bourgbarre (FR)

(73) Assignee: INTERDIGITAL CE PATENT HOLDINGS, Paris (FR)

( * ) Notice: Subject to any disclaimer, the term of this patent is extended or adjusted under 35 U.S.C. 154(b) by 0 days.

(21) Appl. No.: 15/304,527

(22) PCT Filed: Apr. 14, 2015

(86) PCT No.: PCT/EP2015/058027
§ 371 (c)(1),
(2) Date: Oct. 16, 2016

(87) PCT Pub. No.: WO2015/158688
PCT Pub. Date: Oct. 22, 2015

(65) Prior Publication Data
US 2017/0048997 A1     Feb. 16, 2017

(30) Foreign Application Priority Data

Apr. 17, 2014 (FR) ...................................... 14 53486
May 14, 2014 (FR) ...................................... 14 54312

(51) Int. Cl.
*H05K 5/02*       (2006.01)
*H05K 9/00*       (2006.01)
(Continued)

(52) U.S. Cl.
CPC ........... *H05K 5/0247* (2013.01); *H01R 13/03* (2013.01); *H01R 13/6582* (2013.01);
(Continued)

(58) Field of Classification Search
CPC .......... H01R 13/65802; H01R 13/6582; H01R 13/6594–13/6596; H01R 13/6873; H01R 12/7052
See application file for complete search history.

(56) References Cited

U.S. PATENT DOCUMENTS 5,022,871 A * 6/1991 Sekiguchi .......... H01R 23/6873
439/607.19
5,178,562 A * 1/1993 Ermini ............. H01R 13/65802
439/149
(Continued)

FOREIGN PATENT DOCUMENTS

JP       2008171616       7/2008

*Primary Examiner* — Edwin A. Leon
*Assistant Examiner* — Oscar C Jimenez
(74) *Attorney, Agent, or Firm* — Brian J. Dorini, Esq.; Robert D. Shedd, Esq.

(57) ABSTRACT

The disclosure relates to a grounding component for electrically grounding an electronic component comprising an electrically conductive part. In some embodiments, the grounding component comprises: a first positioning element adapted to be positioned on an external face of the electronic component, the external face intended to be at least partially accessible from an outside of a device once the electronic component is installed in the device; a second positioning element adapted to be positioned on a face adjacent to the external face of the electronic component; a first contact element, which is electrically conductive and adapted to come into contact with the electrically conductive part of the electronic component; a second contact element, which is electrically conductive and adapted to come into contact with at least one electrically conductive part of another
(Continued)

component of the device, when the electronic component is installed in the device; the first contact element and the second contact element being adapted to be in electrical contact, the grounding component being adapted to leave completely free access to the other faces of the electronic component which are adjacent to the external face.

20 Claims, 5 Drawing Sheets

(51) Int. Cl.
- *H01R 13/6595* (2011.01)
- *H01R 13/6596* (2011.01)
- *H01R 13/03* (2006.01)
- *H01R 13/6582* (2011.01)
- *H01R 12/72* (2011.01)

(52) U.S. Cl.
CPC ..... *H01R 13/6595* (2013.01); *H01R 13/6596* (2013.01); *H05K 9/0067* (2013.01); *H01R 12/724* (2013.01)

(56) References Cited

U.S. PATENT DOCUMENTS

| | | | | |
|---|---|---|---|---|
| 5,702,271 A * | 12/1997 | Steinman | ........ | H01R 24/64 439/607.25 |
| 5,772,471 A * | 6/1998 | Buck | ........ | H01R 13/65802 439/607.28 |
| 5,913,698 A * | 6/1999 | Keng | ........ | H01R 13/65802 439/607.17 |
| 6,010,365 A * | 1/2000 | Wu | ........ | H01R 13/65802 439/607.02 |
| 6,066,001 A * | 5/2000 | Liptak | ........ | H01R 13/65802 439/108 |
| 6,132,253 A | 10/2000 | Wu | | |
| 6,190,205 B1 * | 2/2001 | Wu | ........ | H01R 13/6582 439/607.34 |
| 6,312,267 B1 * | 11/2001 | Wang | ........ | H01R 13/65802 439/669 |
| 6,343,941 B1 * | 2/2002 | Kan | ........ | H01R 13/65802 439/95 |
| 6,347,961 B2 | 2/2002 | Zhu et al. | | |
| 6,822,879 B2 * | 11/2004 | Rathnam | ........ | G02B 6/4277 361/818 |
| 7,029,331 B1 * | 4/2006 | Lai | ........ | H01R 13/65802 439/607.35 |
| 7,686,646 B2 | 3/2010 | Lee et al. | | |
| 7,810,235 B2 | 10/2010 | Sprouse et al. | | |
| 7,901,221 B1 | 3/2011 | Li et al. | | |
| 9,748,700 B2 * | 8/2017 | Qiao | ........ | H01R 13/65802 |
| 2001/0049230 A1 | 12/2001 | Stickney | | |
| 2002/0025697 A1 | 2/2002 | Kazutoshi | | |
| 2008/0315528 A1 * | 12/2008 | Moore | ........ | G02B 6/4246 277/314 |
| 2009/0233484 A1 * | 9/2009 | Wu | ........ | H01R 13/65802 439/607.05 |
| 2011/0217869 A1 * | 9/2011 | Mullins | ........ | H01R 12/7052 439/571 |
| 2012/0156928 A1 * | 6/2012 | Mullins | ........ | H01R 12/7052 439/573 |
| 2012/0276757 A1 * | 11/2012 | Matsuoka | ........ | H01R 12/722 439/55 |
| 2013/0220692 A1 * | 8/2013 | Feldstein | ........ | H01R 13/6594 174/351 |
| 2013/0224998 A1 * | 8/2013 | Feldstein | ........ | H01R 13/6594 439/607.01 |
| 2014/0273547 A1 * | 9/2014 | Green | ........ | H01R 13/655 439/55 |
| 2016/0072229 A1 * | 3/2016 | Green | ........ | H01R 13/655 439/607.01 |

* cited by examiner

ELECTRICAL GROUNDING COMPONENT AND CORRESPONDING ELECTRONIC BOARD AND ELECTRONIC DEVICE

This application claims the benefit, under 35 U.S.C. § 365 of International Application PCT/EP2015/058027, filed 14 Apr. 2015, which was published in accordance with PCT Article 21(2) on Oct. 22, 2015, in English, and which claims the benefit of French patent application No. 1453486 filed on Apr. 17, 2014 and French patent application No. 1454312 filed on May 14, 2014.

1. FIELD

The field of the disclosure is that of electronic or electrical devices and more specifically the electrical grounding of electronic or electrical components intended to equip such devices.

2. PRIOR ART

Electrical or electronic components are often sensitive to electrostatic or electromagnetic interference, for example to electrostatic discharge (ESD), which can damage them. Such electrostatic discharge can occur between objects having different electrical potentials. Moreover, electromagnetic and/or radio-electrical disturbances can be generated by undesired electrical currents established between components.

Solutions of the prior art therefore sought to protect electronic and/or electrical components from such interference. Some solutions consist in connecting them to an electrical ground. In this way, the component can be continuously discharging, during the operation of the board or of the device to which it belongs, which prevents the accumulation of electrostatic charge.

An existing solution (commonly called a "grounding lug") consists for example in installing a tab on an internal face of a metal panel (or facade) of an electronic board, near the point of insertion of the component to be protected.

The flexibility of the tab allows it to make way for the component when it is inserted, the component being placed between the internal face of the metal panel and the tab.

This solution nevertheless has some disadvantages: in particular, the tab must be installed before mounting the components on the electronic board, at least in the neighborhood of the component to be protected, which limits subsequent corrections or modifications of the implementation schematic of the electronic board. Moreover, there is a risk of incorrectly positioning the tab during insertion of the component. In particular, the tab may be positioned on a non-conductive part of the component, and therefore be ineffectual, or be placed on a fragile part of the component. For example, in the case of an electronic connector such as a USB (Universal Serial Bus) connector, it may penetrate the connector and rest against the internal elements of the connector, for example pins or contacts. As the tab requires a certain rigidity and/or a certain thickness to ensure the contact, its pressing on a fragile part of the connector, during insertion, can cause damage to the fragile part (for example a pulling-out, a deformation and/or an alteration of a surface of an internal element of a connector).

There is therefore a need for a more effective solution than the solutions of the prior art.

3. SUMMARY

The present disclosure makes it possible to improve the situation by proposing a method which is more reliable and easier to implement than the solutions of the prior art, in some embodiments.

More specifically, the present disclosure relates to a component for electrically grounding at least one electronic component, called component to be protected, said component to be protected comprising at least one electrically conductive part and at least one face, called external face, intended to be at least partially accessible from the outside of a device, once said component to be protected is installed in said device, said grounding component being able to be mounted in at least one mounting position on said component to be protected.

According to an embodiment, the electrical grounding component comprises:
- a first positioning element able to be positioned in said mounting position opposite said external face of said component to be protected;
- at least one second positioning element, able to be positioned in said mounting position opposite a face perpendicular to said external face of said component to be protected, said grounding component leaving completely free access to the other faces of said component to be protected which are perpendicular to said external face;
- first contact means, which are electrically conductive and able to come into contact with the conductive part of said component to be protected, in said mounting position, when said component to be protected is installed in said device;
- second contact means, which are electrically conductive and able to come into contact, in said mounting position, with at least one electrically conductive part of another component, when
- said component to be protected is installed in said device; said first and second contact means being able to be in mutual electrical contact.

The component to be protected can notably be an electronic connector, for example a female connector comprising an opening intended for the insertion of a male connector.

The positioning element "opposite" a face of the component to be protected can notably be an element located in a plane substantially parallel to the face, or forming an angled surface, resting on the face, for example with an angle of incidence close to 90 degrees.

Other component is understood here to mean any hardware component capable of forming part of an electronic device and comprising an electrically conductive part. It may notably be a component able to be connected to the electrical ground of the electronic device, such as the rear or front face of the housing of a device, of a metal panel of an electronic board, of a PCB (printed circuit board) of an electronic board, or of a second component, other than the electronic component, belonging to the same electronic device and/or implemented on the same electronic board as the component to be protected, and also having electrical grounding means.

According to a particular characteristic, said electrical grounding component comprises at least one third positioning element able to be positioned in said mounting position opposite a face parallel to said external face of said component to be protected.

According to a particular embodiment, said first, second and/or third positioning element constitutes holding means, able to hold said electrical grounding component in said mounting position on said component to be protected.

According to a particular characteristic, said first, second and/or third positioning element is able to limit the movement of said component in its mounting position in at least one direction of movement.

According to a particular characteristic, said holding means comprise fixing means, able to fix said grounding component to said component to be protected in said mounting position.

According to a particular characteristic, said holding means comprise means for insertion by sliding into said mounting position.

According to a particular characteristic, said holding means comprise means for insertion by clipping.

According to a particular characteristic, said first positioning element is capable of enabling access to an opening arranged in said external face of said component to be protected in said mounting position.

According to a particular characteristic, said electrical grounding component comprises at least one means for enhancing contact reliability, able to keep said first and/or second contact means pressed against said conductive parts in said mounting position.

According to a particular characteristic, said electrical grounding component is able to be mounted on a component to be protected equipping a panel of an electronic board intended to be mounted in an electronic device.

According to a particular embodiment, said positioning elements and/or said first contact means are able to cooperate with at least one standard component to be protected.

According to a particular embodiment, said positioning elements and/or said first contact means are able to cooperate with at least one component to be protected comprising a communication interface capable of enabling an input and/or an output of data, such as an audio and/or video connector.

According to a particular embodiment, said positioning elements and/or said first contact means are able to cooperate with at least one component to be protected belonging to the group comprising: a USB connector;
 a micro USB connector;
 a mini USB connector;
 an HDMI connector;
 an IEE1394 connector.

According to a particular characteristic, said electrical grounding component is made at least partially of a material able to give it an elasticity, and notably a material capable of enabling a deformation of the grounding component sufficient to allow its insertion on the component to be protected.

According to a particular characteristic, said material has a minimum stress before fracture of at least 450 MPa, for example of the order of 520 MPa.

According to a particular characteristic, said material has an elastic limit corresponding to a relative elongation of 0.2% of at least 180 MPa, for example of the order of 205 MPa.

According to a particular characteristic, said material has an elastic elongation (beyond which a fracture occurs) of at least 30%, for example of the order of 40%.

According to a particular characteristic, said material has a contraction at fracture of at least 50%, for example of the order of 60%.

According to a particular characteristic, said material has a thickness of at most 0.3 mm, for example of the order of 0.2 mm.

According to a particular characteristic, said material is a resilient steel.

According to a particular characteristic, said material is a resilient steel of type SUS301, in accordance with the JIS (Japanese Industry Standard).

According to a particular characteristic, said electrical grounding component is formed in a single piece.

According to a particular characteristic, said grounding component is able to protect several electronic components at the same time.

Although not explicitly described, the embodiments presented can be implemented using any combination or sub-combination. For example, an embodiment wherein the elements for positioning the electrical grounding component 100 constitute holding means comprising means for insertion by sliding can be combined with an embodiment wherein these holding means comprise means for insertion by clipping and/or fixing means and/or with an embodiment whose said positioning elements and/or said first contact means are able to cooperate with at least one USB connector.

Other embodiments, easily conceivable by those skilled in the art on reading the present description, are also included within the scope of the present disclosure.

According to another aspect, the present disclosure relates to an electronic board comprising at least one electronic component, called component to be protected, said component to be protected comprising at least one electrically conductive part.

According to a particular embodiment, such an electronic board further comprises at least one component for electrically grounding said electronic component according to any one of the aforementioned embodiments.

According to another aspect, the present disclosure relates to an electronic device comprising at least one electronic component, called component to be protected, said component to be protected comprising at least one electrically conductive part. Said device may also comprise an electronic board, for instance an electronic board on which said component to be protected is mounted.

According to a particular embodiment, such a device further comprises at least one component for electrically grounding said electronic component according to any one of the aforementioned embodiments and said other component, with which said second contact means are able to come into contact, is mounted in said electronic device.

Such a device can notably be an access gateway to a communication network, a decoder (set top box), or a computer, for example a PC (personal computer).

Naturally, the present disclosure applies to the protection of any electronic component comprising an electrically accessible conductive part, this component being able for example to be intended to be mounted in an electronic board and/or an electronic device such as a laptop computer, an office computer, a computing server, a telephone, video processing devices, sound devices, or lighting devices, this list being non-exhaustive.

5. LIST OF FIGURES

The present disclosure will be better understood, and other specific features and advantages will emerge upon reading the following detailed description, relating to a particular embodiment, the description making reference to the annexed drawings wherein.

A same element is designated in all the figures by the same reference symbol.

The figures shown are for illustrative purposes only and in no case limit the present disclosure to the embodiments shown.

5. DESCRIPTION OF EMBODIMENTS

Figure 1:
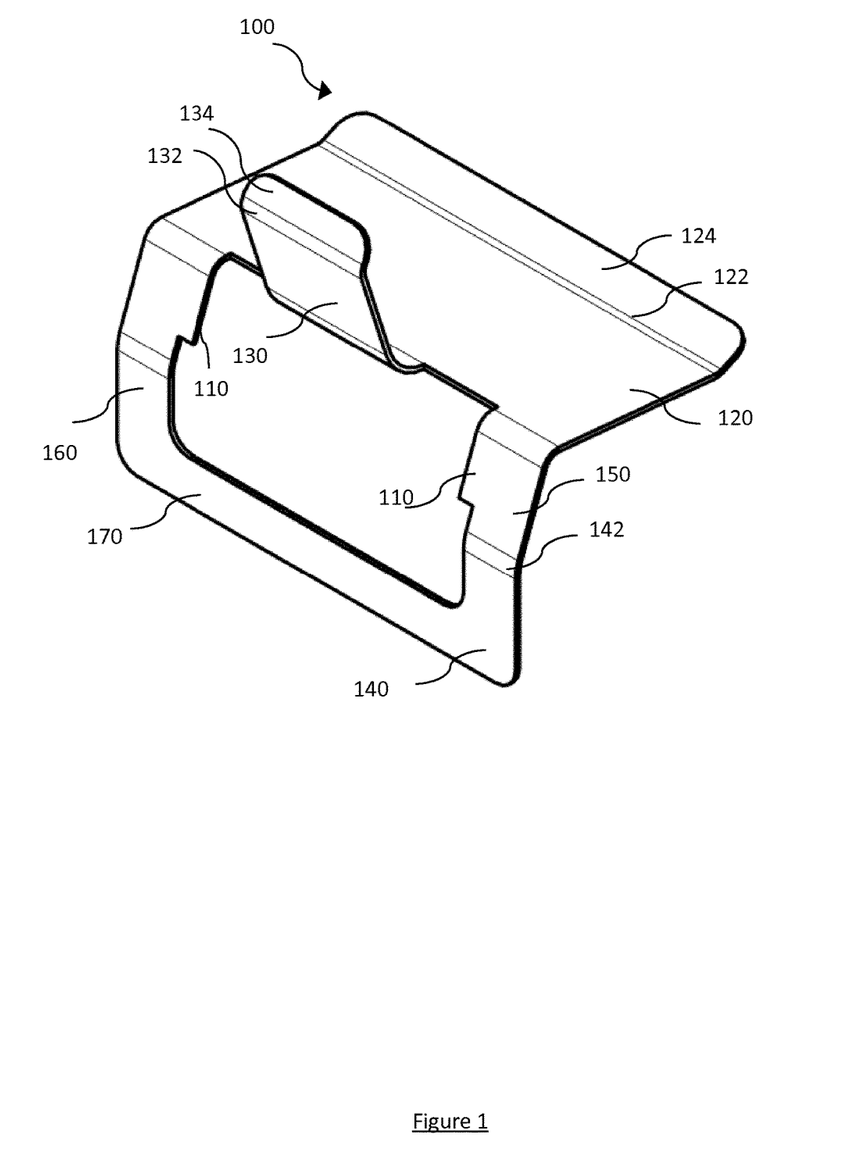
FIG. 1 shows a perspective view of an electrical grounding component according to a particular embodiment.

The general principle of the present disclosure is presented in relation to FIG. 1. In at least one embodiment, an electrical grounding component 100 is proposed, able to electrically ground at least one electronic component (or component to be protected) comprising at least one electrically conductive part, mounted on this component to be protected.

According to an embodiment of the present disclosure, the component comprises positioning elements 170, 120 forming holding means and enabling its installation on the component to be protected in a mounting position, and is able to ensure an electrical contact, via at least first and second electrically connected electrical contact means (or contact elements) 110, 122, 132, 140, between a conductive part of the component to be protected and another conductive part of another component, in order to enable the electrical grounding of the component to be protected, when it is installed in this mounting position.

The conductive part of the component to be protected with which the electrical grounding component can establish a contact via first contact means 122 can for example be located on an external face of the housing of the component to be protected, on which rests the electrical grounding component at the level of at least one contact point 122.

The second contact means able to establish an electrical contact with a component other than the component to be protected can notably enable a contact with an inner or outer surface of the housing of an electronic device, for example the electronic device wherein the component to be protected is installed. It can in particular be a surface of a face, located on a rear, side, or front part of the electronic device, on which openings are arranged which enable for example assembly of a third-party device with the electronic device (such as a USB key in the case of the protection of a USB port belonging to a laptop computer). In other embodiments, possibly complementary embodiments, the second contact means 132 can enable the establishment of an electrical contact with a metal panel of an electronic board, notably a board incorporating the component to be protected. Such embodiments are for example adapted to a protection of a connector accessible from the panel of an electronic board or implemented near the panel of a board. The second contact means 140 can also enable a contact with a conductive surface of an edge of the PCB (printed circuit board) of an electronic board, or with a conductive surface of a second component, other than the electronic component, belonging to the same electronic device and/or implemented on the same electronic board as the component to be protected, and also having electrical grounding means. It can notably be a component implemented near the component to be protected. Thus, in the case of an electrical grounding component adapted to the protection of a USB connector, the second contact means can notably be able to establish an electrical contact with at least one second connector (also of USB type or of another type) which is a neighbor of this USB connector.

Figure 2:
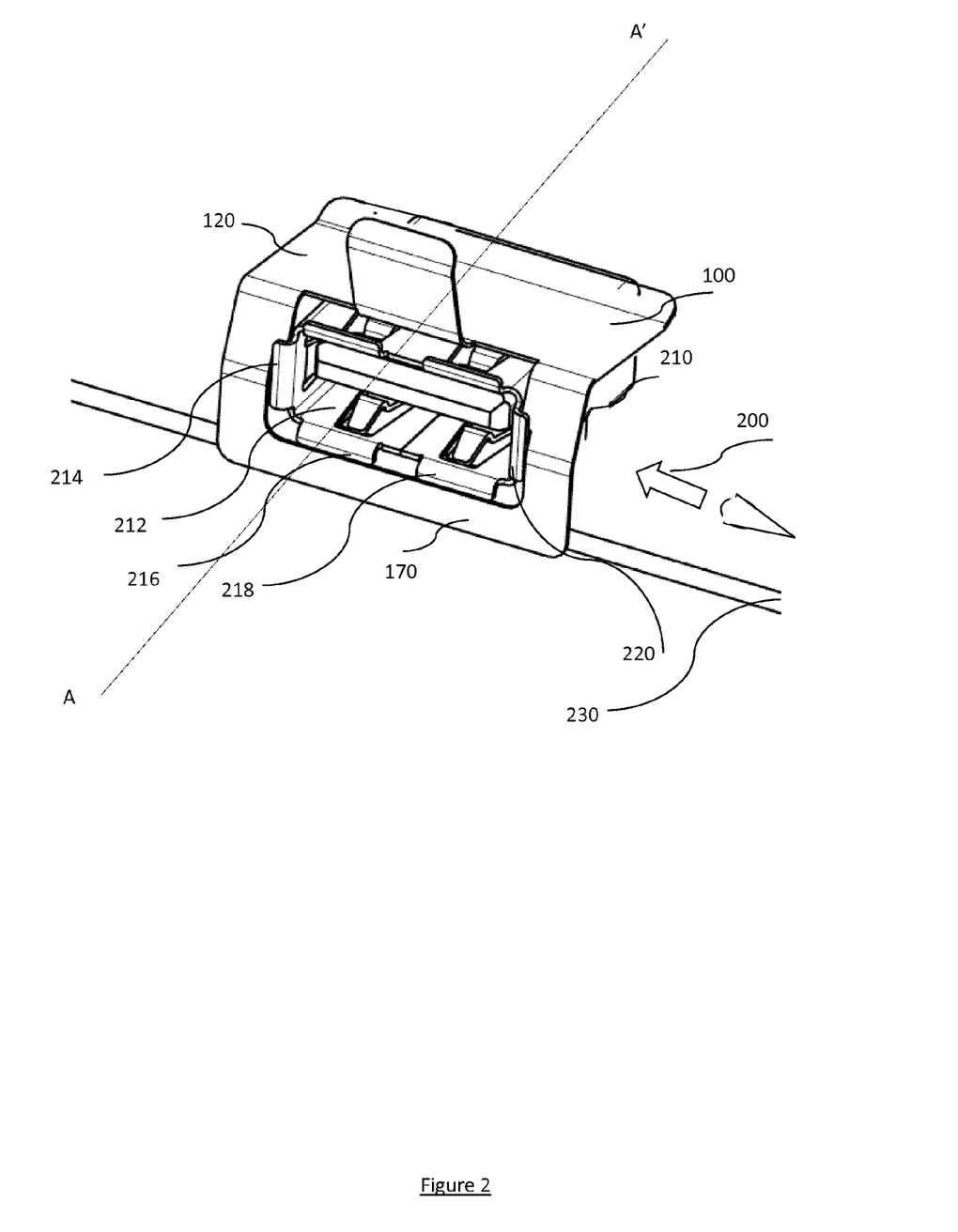
FIG. 2 shows a perspective view of the component of FIG. 1, in a mounting position, wherein it is mounted on a USB connector equipping an electronic board, according to a particular embodiment compatible with the embodiment shown in FIG. 1.

An electrical grounding component 100 according to a particular embodiment is now presented in more detail in relation to FIGS. 1 and 2.

The component 100 shown is notably adapted to an electrical grounding of a USB connector 210, as shown in FIG. 2, comprising on one face (called the front face or external face) an opening 212, intended for the insertion of a USB plug or of a USB key. The electrical grounding component shown can also be adapted to the electrical grounding of other components, for example components having shapes and/or dimensions similar to a standard USB or HDMI connector.

In the particular embodiment shown, the component 100 is made entirely in a single piece from an electrically conductive material, for example a metal, notably a resilient stainless steel.

In other embodiments, notably when the electrical grounding component 100 is an assembly of several elements, only some elements, electrically connected to each other, can be electrically conductive.

In the embodiment shown in FIGS. 1 and 2, the component 100 comprises a frame 170, forming a first positioning element of the electrical grounding component, able to be positioned around the opening 212 of the USB connector 210, in a mounting position, and a return 120, forming a second positioning element of the electrical grounding component, able to be positioned in contact with a face substantially perpendicular to the face of the connector comprising the opening 212.

In other embodiments, the return (for example in the shape of a rake) can comprise several second positioning elements, all located in a same plane for example, and able to all be positioned in contact with a single and same face, substantially perpendicular to the face of the connector comprising the opening 212.

In the particular embodiment shown, the frame 170 notably comprises sides 140, 150, 160. It can thus make it possible for the electrical grounding component 100 to be held in its mounting position, due notably to the side 140 and to retaining elements 110 which comprise the sides 150 and 160. Some sides 150, 160 can notably comprise retaining elements 110 (these elements also forming for example, as in the embodiments shown, electrical contact means) which can take for example the form of lugs or rims.

Thus, in the embodiment shown in FIGS. 1 and 2, some sides 140, 150, 160 of the frame are able to cooperate with a conductive element, for example a rim 214, 216, 218, 220, or of the electronic board on which the connector is mounted, in order to limit the freedom of movement of the electrical grounding component 100 in at least one direction of movement. For example, with reference to FIGS. 1 and 2, the retaining elements 110 can prevent separation of the electrical grounding component 100 of the electronic board 230 and the holding means 170, 120 can prevent tilting of the electrical grounding component 100.

Figure 5A:
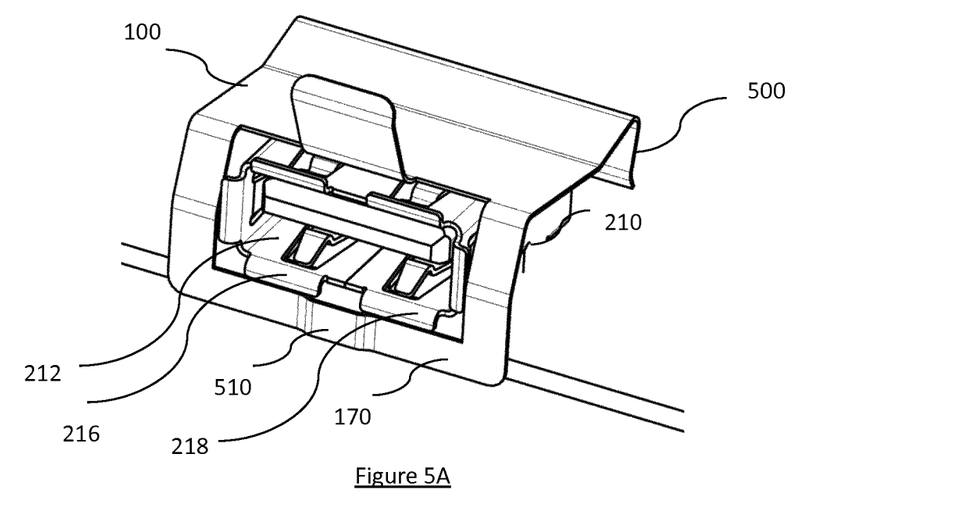
FIG. 5A shows a perspective view of an electrical grounding component in another embodiment than that shown in FIG. 1, in a mounting position, wherein it is mounted on a USB connector equipping an electronic board.
Figure 5B:
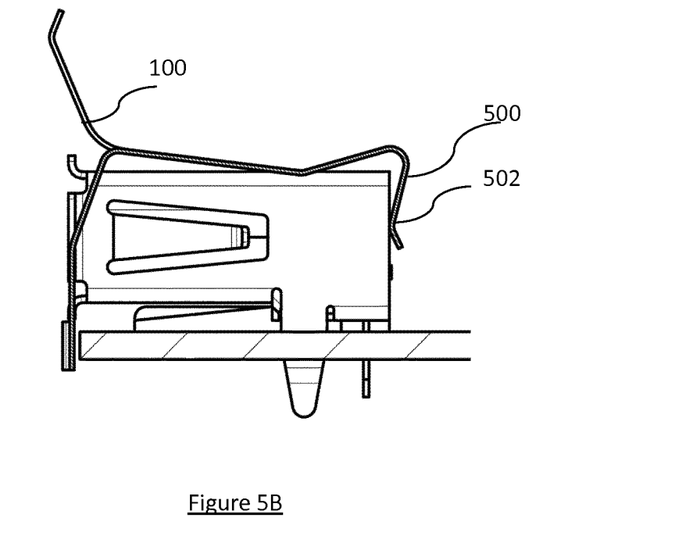
FIG. 5B shows a profile view of the electrical grounding component, of the USB connector and of the electronic board shown in FIG. 5A.

In some embodiments, notably when the electrical grounding component does not comprise retaining means able to prevent its separation from the component to be protected (notably because the USB connector does not comprise a rim forming an insertion ramp for a USB plug, rendering the retaining means 110 non-operational), the means for holding the electrical grounding component can comprise a third positioning element 500, as shown in FIGS. 5A and 5B, able to be positioned opposite a face parallel to the opening face of the connector, for example a positioning element able to come into contact with the face of the connector opposite the face where the opening 212 is located. This third positioning element can in particular have a bend 502, or a flat surface, which can also constitute an electrical contact means. Such an embodiment makes it possible to keep the contact means 502 pressed against corresponding conductive parts of the component to be protected 210 and to obtain an even contact surface making the physical contact less sensitive to jolts, notably when the electrical grounding component 100 is installed in a mobile device.

An embodiment such as the embodiment shown in FIGS. 1 to 4, where the electrical grounding component is in an "L" shape, or an embodiment as mentioned in relation to FIGS. 5A and 5B, where the electrical grounding component is in a U shape but has a single side wall perpendicular to the opening face (the third branch of the "U" being formed by a return of the single perpendicular wall on the rear face of the connector) offer the advantage of being able to position the electrical grounding component easily on the USB connector, even after its implementation on an electronic board, whether this implementation be horizontal or vertical. In fact, as the electrical grounding component can be inserted plumb with the connector (for example in a direction of movement perpendicular to the circuit of the electronic board), the ease of insertion is impacted little by the orientation of the connector or the presence of other components implemented on the board near the connector.

In the particular case shown, where the component to be protected 210 comprises a substantially flat opening 212 equipped with rims, and where the electrical grounding component 100 is made of a material having a certain elasticity (for example a resilient stainless steel, notably a stainless steel of type SUS301), the electrical grounding component 100 is able to be inserted by clipping it around the opening 212 of the connector 210. Thus, as will be seen more easily in relation to FIG. 2, the electrical grounding component 100 can for example be moved close to the opening 212, so that the frame 170 is placed in a plane substantially parallel to the plane of the opening 212 and the return 120 in a plane substantially parallel to the substantially perpendicular face of the connector 210. The electrical grounding component 100 is then moved closer, so that the frame 170 presses on the rims 214, 216, 218, 220. Pressing a little harder enables the positioning of the retaining elements 110 and/or of the side 140 of the frame 170 on the rear face (with respect to the opening of the connector) of the rims 214, 216, 218, 220 of the connector 210.

Figure 4:
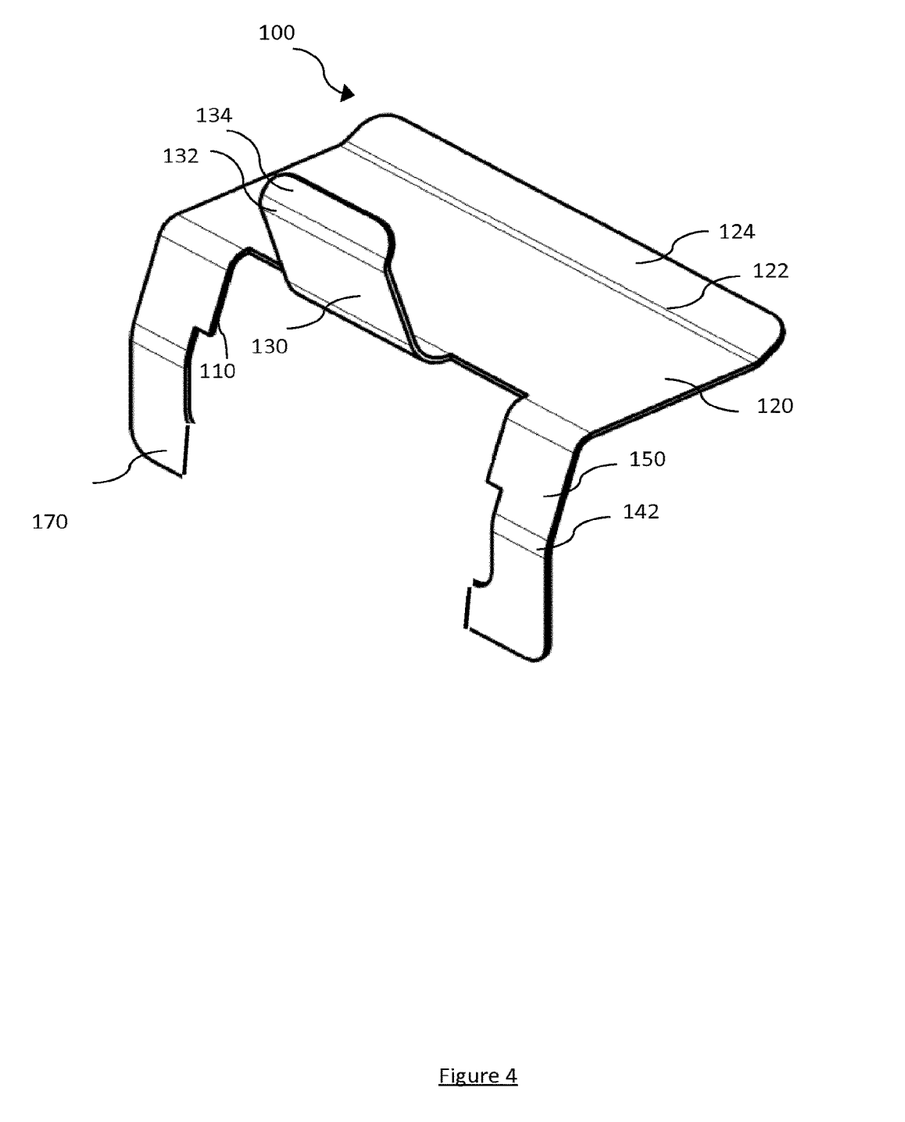
FIG. 4 shows a perspective view of an electrical grounding component according to another particular embodiment.

In some embodiments of the present disclosure, as shown in FIG. 4 notably, the means for holding the electrical grounding component 100 can be suitable for an insertion by sliding of the electrical grounding component 100 into its mounting position.

As shown, some means for holding the component can enable a certain freedom of movement of the component 100. Such embodiments can thus enable an easier installation of the component, or an adaptation to different models of connectors, or to connectors of the same type but of slightly different dimensions, due for example to manufacturing tolerance.

In other embodiments, the holding means may not allow any movement of the electrical grounding component 100 in its mounting position. Such holding means can for example be constituted by fixing means (for example screws, fasteners, and/or crimping elements) able to join the electrical grounding component 100 to the component to be protected 210.

Figure 3A:
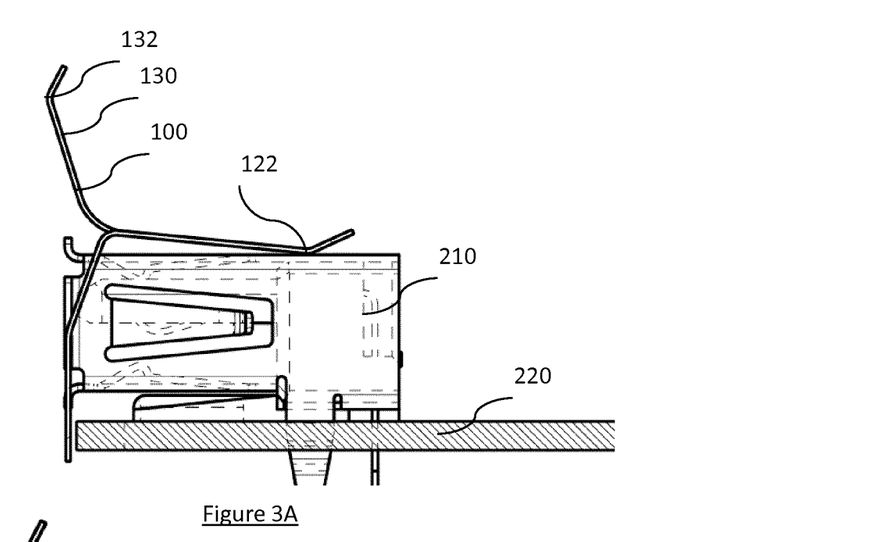
FIG. 3A shows a profile view of the electrical grounding component, of the USB connector and of the electronic board shown in FIG. 2.
Figure 3B:
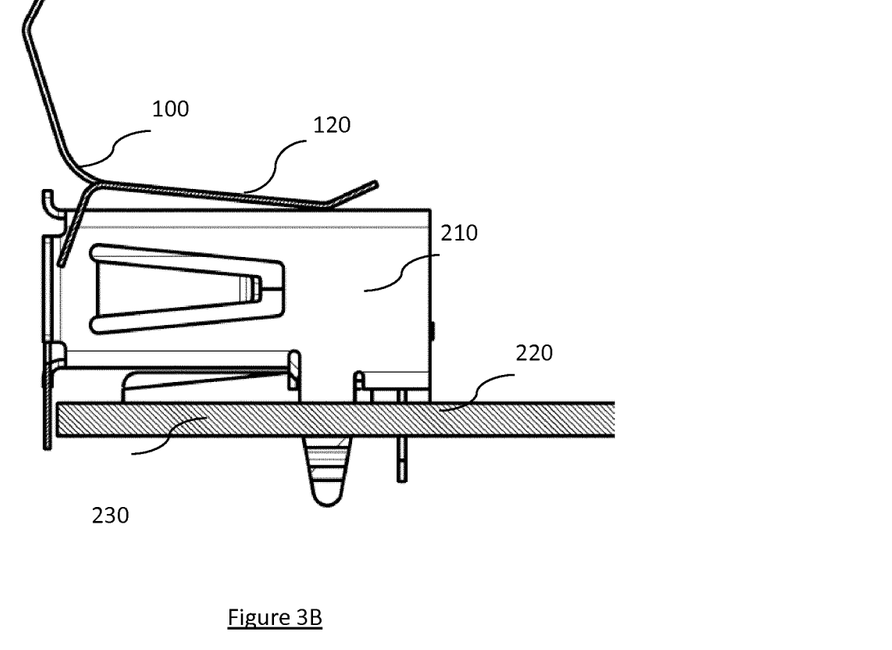
FIG. 3B shows a longitudinal cross-section view of the electrical grounding component, of the USB connector and of the electronic board shown in FIG. 2.

The electrical contact means of the component 100 are now presented, mainly in relation to FIGS. 2, 3A and 3B. FIGS. 3A and 3B both show the electrical grounding component 100, the USB connector 210 and the electronic board of FIG. 2.

FIG. 3A is a profile view, from the viewpoint 200 indicated in FIG. 2, of the elements of FIG. 2. FIG. 3B is a longitudinal cross-section view along the A-A' axis shown in FIG. 2.

The electrical grounding component 100 comprises first means for electrical contact 122 with the component to be protected and second means for electrical contact 132, 140 with another component. These electrical contacts can notably be positioned on a part of the holding means 170, 120 able to come into continuous contact with a conductive part of the component to be protected or of another component in the mounting position of the electrical grounding component 100. They can also be positioned on the electrical grounding component 100 on parts not acting as holding means.

In the embodiment shown, the electrical grounding component 100 notably comprises first electrical contact means 122 located on the return 120 and able to come into electrical and mechanical contact with the face of the connector 210 located opposite the return 120 and substantially perpendicular to the opening 212 of the connector. In the particular embodiment shown, the component 100 comprises a tab 130, facilitating the manipulation of the component 100 and also comprising second electrical contact means 132. The more or less large, possibly adjustable, length of the tab can be capable of also enabling the establishment of an electrical contact with another component more or less far away from the component to be controlled. In other words, the tab can enable the implementation of shifted contact means.

The second electrical contact means can notably come into contact with the internal face of the panel of an electronic board, when the electrical grounding component 100 is positioned, in its mounting position, on a connector accessible from this panel.

The side 140 can also constitute an electrical contact means, possibly complementary.

In some embodiments, a single element of the electrical grounding component 100 can enable both an electrical contact with the component 210 to be protected and another component. For example, when a component to be protected equipped with the electrical grounding component 100 presented is installed at the edge of an electronic board 220, the side 140 can enter into contact both with the rims 216 and 218 of the connector 210 and with the edge 230 of the printed circuit board of the electronic board.

In some embodiments, the frame 170 can in particular have a central raised surface 510, shown in FIG. 5A, intended to ensure that the frame is positioned outside the rims 216 and 218 during its mounting.

Naturally, the first and second contact means of the electrical grounding component 100 can be multiple, so as to enable for example the establishment of several electrical bridges notably in order to enhance the reliability of the electrical grounding component 100, or to enable an adaptation of the electrical grounding component 100 to components to be protected of various shapes and/or to varied implementations, on an electronic board, of components to be protected, notably.

In some embodiments, the shape of the elements bearing the contact means 122, 132 can be adapted to enable a better physical contact between the contact means 122, 132 and the corresponding conductive parts of the component to be protected or of another component.

For example, as is seen clearly in the particular embodiment of FIGS. 3A, 3B and 5B, the sides 150 and 160, the tab 130, the return 120 and the third positioning element 500 can have bends 122, 132, 142, 502 so as to keep the contact means 122, 132, 142, 502 pressed against the corresponding conductive parts of the component to be protected or of another component. Moreover, the positioning of the contact means 122, 132 in a bend or a flat surface and not in an end can make it possible to obtain an even, possibly larger, contact surface, and to make the physical surface less sensitive to jolts, for example when the electrical grounding component 100 is intended for a mobile device (for example a telephone, a gamepad, a mobile PC, etc.).

The electrical grounding component 100 can also comprise means for facilitating insertion, for example via bent ends 124, 134 of the return 120 and of the tab 130, which can contribute to guiding the component towards the mounting position. Moreover, when the electrical grounding component is made by punching, the cutting areas can comprise burrs capable of preventing the sliding of the component during mounting. The bending of the ends, which shifts the contact area, can therefore enable a better sliding of the component and therefore facilitate its insertion.

In some embodiments, notably embodiments where the electrical grounding component 100 is positioned, in its mounting position, on a connector accessible from a panel of an electronic board, the shape of the electrical grounding component 100 can be chosen so as to have a relatively flat face on the side of the component turned towards the panel, so as to be able to enable for example the positioning of the electrical grounding component 100 between the component to be protected and the panel.

In other embodiments, possibly complementary embodiments, notably embodiments where the electrical grounding component 100 is positioned, in its mounting position, on a connector mounted on a panel or at the periphery of an electronic board intended to be installed in a device some of the dimensions of which are close to those of the board, the shape of the electrical grounding component 100 can be chosen so as to have a relatively flat face on the side of the component turned towards the panel, so as to be able to enable for example the insertion of the board in the device, even when the space available between the board and the wall of the device is limited.

In some embodiments, as in some embodiments compatible with the embodiment shown in FIG. 1 for example, the grounding component is usable on any components and/or electronic boards, without requiring the use of a particular receptacle intended to accommodate the component to be protected, or the presence of particular anchoring means (such as holes for example) on the electronic board to be equipped.

In the illustrated embodiments, the electrical grounding component of the present disclosure is intended to be mounted on a single component to be protected. In other embodiments, the electrical grounding component can be intended to protect several components at the same time, for example by equipping a set of several components to be protected. In this case, it can for example be mounted, via holding means, on one of the components to be protected, in a mounting position, and comprise first means of contact with each of the components to be protected. It can also be mounted on several components to be protected, the means for holding the electrical grounding component being able to be positioned at least partially on several components to be protected.

At least some embodiments of the present disclosure make it possible to have a component adaptable to at least one standard component type.

At least some embodiments of the present disclosure make it possible to have a component adaptable to several types of component to be protected, notably components of different size and/or shape, and/or which are able to be mounted in several mounting positions on a same component. Moreover, the proposed solution makes it possible, at least in some embodiments, to install on at least one component to be protected at least one electrical grounding component, even after manufacture of an electronic device (for example, because an electrostatic charge problem is detected during use of the electronic device) or after implementation of the components on an electronic board. They can notably make it possible to correct an error and/or an imprecision of design and/or of manufacture, for example a problem detected during a visual or electrical test of the electronic board. A visual test can thus highlight the absence of contact between a component and the edge of the panel of an electronic board, due notably to manufacturing tolerances of the panel and therefore the necessity for mounting on the component to be protected at least one electrical grounding component according to the present disclosure.

In particular, some embodiments enable an installation of the electrical grounding component on a component to be protected after the implementation of this component to be protected on an electronic board in one or more implementation positions. This can notably be the case when the electrical grounding component comprises a single positioning element located opposite a single one of the faces of the component to be protected perpendicular to a face, called external face, of the component to be protected, intended for example to remain at least partially accessible from the outside of a device, once the electronic board is installed in this device (for example when the positioning elements form an L, or in case of absence, on the electrical grounding component, of walls, other than the return 120, perpendicular to the positioning element able to be positioned on the opening face (or external face) of a connector).

In a variant, also adapted to a use in several implementation positions, the electrical grounding component can comprise several positioning elements, all located opposite a single and same face of the component to be protected perpendicular to the external face of the component to be protected. This external face can notably be located at the periphery of the electronic board.

Thus in some embodiments, the electrical grounding component can for example be able to equip an electronic connector comprising a rectangular opening, whether the connector is implemented on an electronic board so that the length of the opening is parallel to the plane of the electronic board or the connector is implemented on the board so that the length of the opening is perpendicular to the plane of the electronic board (or in other words the connector is implemented vertically or horizontally with respect to the board). The mounting position of the electrical grounding component can for example be defined according to an occupation of the board around the component to be protected and/or an ease of access to the component.

Such embodiments of the present disclosure where the mounting of an electrical grounding component is carried out after the implementation of the component to be protected also offer a solution adapted to significant time and/or cost constraints, to avoid notably a specific development. For example, they can make it possible to reuse an existing panel defined for another hardware development, and therefore enable a relative saving at the board's physical design stage.

Moreover, some embodiments make a large electrical contact surface possible, for example when the first and/or second contact means are multiple points or have a large surface area, and can therefore make it possible to have a more reliable solution than the solutions of the prior art, therefore giving good ESD results.

The invention claimed is:

1. A grounding component for electrically grounding at least one electronic component, said grounding component comprising:
 a first positioning element adapted to be positioned on an external face of said electronic component, said external face intended to be at least partially accessible from an outside of a device once said electronic component is installed in said device;
 a second positioning element adapted to be positioned on a first face adjacent to said external face of said electronic component, said first face comprising at least one electrically conductive part;
 a first contact element, which is electrically conductive and adapted to come into contact with the electrically conductive part of said first face of said electronic component;
 a second contact element, which is electrically conductive and adapted to come into contact with at least one electrically conductive part of another component of said device, when said electronic component is installed in said device and said grounding component is mounted on said electronic component; wherein said first contact element and said second contact element being adapted to be in mutual electrical contact; and
 all parts of said grounding component located opposite to a face of said electronic component adjacent to said external face being located opposite to said first face, said grounding component comprising at least one third positioning element adapted to be positioned on a rear face, with respect to said external face, of said electronic component.

2. The grounding component according to claim 1 wherein said first positioning element, said second positioning element and/or said third positioning element is adapted to hold said grounding component in a mounting position on said electronic component.

3. The grounding component according to claim 1 wherein said first positioning element, said second positioning element and/or said third positioning element is adapted to limit the movement of said grounding component in at least one direction of movement when said grounding component is mounted on said electronic component.

4. The grounding component according to claim 1 wherein said second contact element comprise at least one tab.

5. The grounding component according to claim 1 wherein said first positioning element, said second positioning element, said third positioning element and/or said first contact element are adapted to cooperate with at least one standard electronic component.

6. The grounding component according to claim 1 wherein said grounding component is made at least partially of a material adapted for enabling a deformation of the grounding component sufficient to enable its insertion on the electronic component.

7. The grounding component according to claim 1 wherein said grounding component is made at least partially of resilient stainless steel.

8. The grounding component according to claim 1 wherein said grounding component is adapted to protect several electronic components at the same time.

9. The grounding component according to claim 1 wherein said grounding component is adapted to be mounted in several mounting positions on a same electronic component.

10. The grounding component according to claim 1 wherein said grounding component comprises at least one contact enhancement element adapted to keep said first contact element pressed against said electrically conductive part of said electronic component and/or said second contact element pressed against said electrically conductive part of said other component of said device.

11. The grounding component according to claim 10 wherein said at least one contact enhancement element comprises at least one bend defining a first and a second part of said second positioning element.

12. An electronic board comprising at least one electronic component, said electronic board comprising at least one grounding component for electrically grounding said electronic component, said grounding component comprising:
 a first positioning element adapted to be positioned on an external face of said electronic component, said external face intended to be at least partially accessible from an outside of a device once said electronic board is installed in said device;
 at least one second positioning element adapted to be positioned on a first face adjacent to said external face of said electronic component, said first face comprising at least one electrically conductive part,
 a first contact element being electrically conductive and adapted to come into contact with the electrically conductive part of said first face of said electronic component;
 a second contact element being electrically conductive and adapted to come into contact with at least one electrically conductive part of another component of said device, when said electronic board is installed in said device and said grounding component is mounted on said electronic component; wherein
 said first contact element and said second contact element being adapted to be in mutual electrical contact; and
 all parts of said grounding component located opposite to a face of said electronic component adjacent to said external face being located opposite to said first face, said grounding component comprising at least one third positioning element adapted to be positioned on a rear face, with respect to said external face, of said electronic component.

13. The electronic board according to claim 12 wherein said grounding component comprises at least one contact enhancement element adapted to keep said first contact element pressed against said electrically conductive part of said electronic component and/or said second contact element pressed against said electrically conductive part of said other component of said device.

14. The electronic board according to claim 13 wherein said at least one contact enhancement element of said grounding component comprises at least one bend defining a first and a second part of said second positioning element.

15. The electronic board according to claim 12, wherein said first face is a face located opposite to said electronic board and distal to said electronic board.

16. An electronic device comprising at least one electronic component, and at least one grounding component for electrically grounding said electronic component, said grounding component being adapted to be mounted on said electronic component, said grounding component comprising:
- a first positioning element adapted to be positioned on an external face of said electronic component, said external face intended to be at least partially accessible from an outside of said electronic device;
- at least one second positioning element adapted to be positioned on a first face adjacent to said external face of said electronic component, said first face comprising at least one electrically conductive part;
- a first contact element being electrically conductive and adapted to come into contact with the electrically conductive part of said first face of said electronic component;
- a second contact element being electrically conductive and adapted to come into contact with at least one electrically conductive part of another component of said electronic device when said electronic component is installed in said electronic device and said grounding component is mounted on said electronic component; wherein;

said first contact element and said second contact element being adapted to be in mutual electrical contact; and
- all parts of said grounding component located opposite to a face of said electronic component adjacent to said external face being located opposite to said first face, said grounding component comprising at least one third positioning element adapted to be positioned on a rear face, with respect to said external face, of said electronic component.

17. The electronic device according to claim 16 wherein said first positioning element is adapted for enabling access to an opening arranged in said external face of said electronic component.

18. The electronic device according to claim 16 wherein said grounding component is adapted to protect several electronic components of said electronic device at the same time.

19. The electronic device according to claim 16 wherein said grounding component comprises at least one contact enhancement element adapted to keep said first contact element pressed against said electrically conductive part of said electronic component and/or said second contact element pressed against said electrically conductive part of said other component of said device.

20. The electronic device according to claim 19 wherein said at least one contact enhancement element of said grounding component comprises at least one bend defining a bend defining a first and a second part of said second positioning element.

* * * * *